United States Patent
Forrest et al.

(10) Patent No.: US 6,483,863 B2
(45) Date of Patent: Nov. 19, 2002

(54) ASYMMETRIC WAVEGUIDE ELECTROABSORPTION-MODULATED LASER

(75) Inventors: Stephen R. Forrest; Milind R. Gokhale, both of Princeton; Pavel V. Studenkov, Monmouth Junction, all of NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 09/891,639

(22) Filed: Jun. 26, 2001

(65) Prior Publication Data

US 2002/0097941 A1 Jul. 25, 2002

Related U.S. Application Data

(60) Provisional application No. 60/262,863, filed on Jan. 19, 2001.

(51) Int. Cl.[7] .............................................. H01S 5/026
(52) U.S. Cl. .......................... 372/50; 372/26; 372/102
(58) Field of Search ............................ 372/50, 102, 26

(56) References Cited

U.S. PATENT DOCUMENTS

| | | | |
|---|---|---|---|
| 5,039,189 A | 8/1991 | Lytel et al. ...................... 385/2 |
| 5,140,149 A | 8/1992 | Sakata et al. ................ 250/211 |
| 5,208,878 A | 5/1993 | Thulke .......................... 385/14 |
| 5,325,379 A | 6/1994 | Amann ......................... 372/20 |
| 5,355,386 A | 10/1994 | Rothman et al. ............. 372/50 |
| 5,499,259 A | 3/1996 | Makita ......................... 372/45 |
| 5,509,094 A | 4/1996 | Minami et al. ................ 385/29 |
| 5,511,084 A | 4/1996 | Amann ......................... 372/20 |
| 5,568,311 A | 10/1996 | Matsumoto .................. 359/344 |
| 5,574,742 A | * 11/1996 | Ben-Michael et al. ........ 372/45 |
| 5,623,363 A | 4/1997 | Liou ........................... 359/344 |
| 5,663,824 A | 9/1997 | Koch et al. .................. 359/184 |
| 5,721,750 A | 2/1998 | Kwon et al. .................... 372/45 |
| 5,852,687 A | 12/1998 | Wickham ....................... 385/14 |
| 5,859,866 A | 1/1999 | Forrest et al. ................. 372/50 |
| 5,985,685 A | 11/1999 | Lealman et al. ............... 385/28 |
| 6,167,073 A | 12/2000 | Botez et al. ................... 372/46 |
| 6,198,863 B1 | 3/2001 | Lealman et al. ............... 385/37 |
| 6,240,233 B1 | 5/2001 | Weinert et al. ............. 385/131 |

FOREIGN PATENT DOCUMENTS

WO  WO 99/67665  12/1999

OTHER PUBLICATIONS

Studenkov, P. V., et al., "Efficient Coupling in Integrated Twin–Waveguide Lasers Using Waveguide Tapers", *IEEE Photonics Technology Letters*, vol. 11, No. 9, pp. 1096–1098, Sep. 1999.

Studenkov, P. V., et al., "Asymmetric Twin–Waveguide 1.55–μm Wavelength Laser with a Distributed Bragg Reflector", *IEEE Photonics Technology Letters*, vol. 12, No. 5, pp. 468–470, May 2000.

Studenkov, P. V., et al., "Monolithic Integration of a Quantum–Well Laser and an Optical Amplifier Using an Asymmetric Twin–Waveguide Structure", *IEEE Photonics Technology Letters*, vol. 10, No. 8, pp. 1088–1090, Aug. 1998.

U.S. patent application Ser. No. 09/717,851, Forrest et al., filed Nov. 21, 2000.

U.S. patent application Ser. No. 09/337,785, Forrest et al., filed Jun. 22, 1999.

* cited by examiner

*Primary Examiner*—James Davie
(74) *Attorney, Agent, or Firm*—Woodcock Washburn LLP

(57) ABSTRACT

A modulated laser device comprising two or more vertically stacked asymmetric waveguides is provided. The laser device comprises a first waveguide having a gain region formed therein for amplifying at least a first mode of light, and a second waveguide vertically coupled to the first waveguide and having a modulator formed therein for modulating a second mode of light having an effective index of refraction different from the first mode. Light propagating in the first waveguide is transferred into the second waveguide via a lateral taper in the first waveguide. The laser device may further comprise a third waveguide positioned between the first and second waveguide for providing isolation between the gain region and modulator. Distributed bragg reflector (DBR) and distributed feedback (DFB) laser designs may be employed in the device.

39 Claims, 14 Drawing Sheets

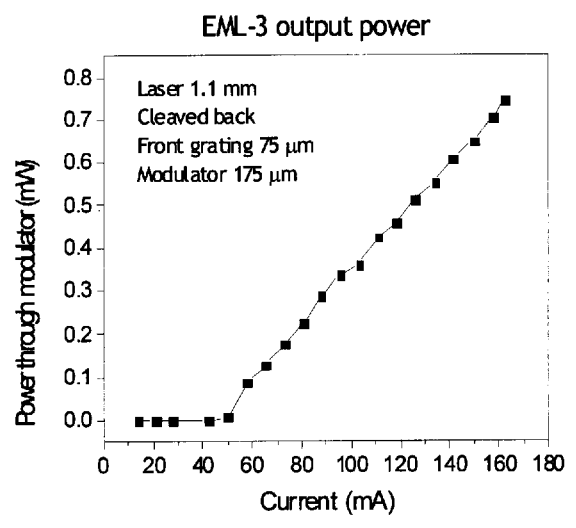
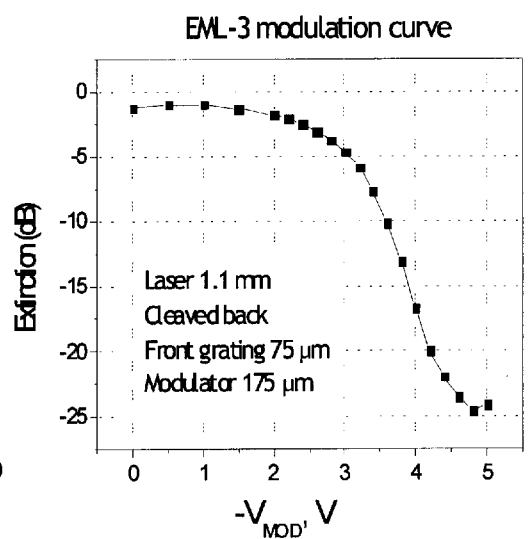
FIG. 7A  FIG. 7B

ASYMMETRIC WAVEGUIDE ELECTROABSORPTION-MODULATED LASER

RELATED APPLICATIONS

This application is related by subject matter and claims priority to U.S. Provisional Patent Application Serial No. 60/262,863, filed Jan. 19, 2001, entitled "Asymmetric Waveguide Electroabsorption-Modulated Laser," the contents of which are hereby incorporated by reference in their entirety.

FIELD OF THE INVENTION

The present invention relates generally to the field of optical communications devices, and more particularly to lasers.

BACKGROUND OF THE INVENTION

Photonic integrated circuits (PIC) provide an integrated technology platform increasingly used to form complex optical circuits. PIC technology allows multiple optical devices, both active and passive, to be integrated on a single substrate. For example, PICs may comprise integrated lasers, integrated receivers, waveguides, detectors, semiconductor optical amplifiers (SOA), gratings, and other active and passive semiconductor optical devices. Monolithic integration of active and passive devices in PICs provides an effective integrated technology platform for use in optical communications.

A particularly versatile PIC platform technology is the integrated twin waveguide (TG) structure. Twin waveguide combines active and passive waveguides in a vertical directional coupler geometry using evanescent field coupling. The TG structure requires only a single epitaxial growth step to produce a structure on which active and passive devices are layered and fabricated. That is, TG provides a platform technology by which a variety of PICS, each with different layouts and components, can be fabricated from is the same base wafer. Integrated components are defined by post-growth patterning, eliminating the need for epitaxial regrowth. Additionally, the active and passive components in a TG-based PIC can be separately optimized, with post-growth processing steps used to determine the location and type of devices on the PIC.

The conventional TG structure, however, suffers from the disadvantage that waveguide coupling is strongly dependent on device length, due to interaction between optical modes. For PIC devices such as lasers, the interaction between optical modes results in an inability to control the lasing threshold current and coupling to passive waveguides as a consequence of the sensitivity to variations in the device structure itself. The sensitivity to variations arises from the interaction between the different optical modes of propagation in the conventional TG structure. This interaction leads to constructive and destructive interference in the laser cavity, which affects the threshold current, modal gain, coupling efficiency and output coupling parameters of the device. The conventional TG structure suffers from unstable sensitivity of performance characteristics due to device length, even/odd mode interaction, and variations in the layered structure.

In U.S. patent application Ser. No. 09/337,785, filed on Jun. 22, 1999, entitled "Twin Waveguide Based Design for Photonic Integrated Circuits," the contents of which are hereby incorporated by reference in their entirety, Applicants disclose a modified TG structure, referred to as an asymmetric twin waveguide (ATG) which addresses some of the performance problems of the conventional TG structure. The ATG structure significantly reduces modal interference by confining different modes of light to propagation in different waveguides. This is accomplished by designing each of the single mode waveguides that are comprised in the twin waveguide such that the mode of light that propagates in each of the two waveguides has a different effective index of refraction. The asymmetric waveguides may be laterally tapered to reduce coupling losses by resonant or adiabatic coupling of the optical energy between the first and second waveguide. The asymmetric waveguide design significantly reduces the interaction between optical modes and therefore represents a great improvement over traditional TG devices.

While the ATG promises to be a versatile platform, Applicants recognized a need to deliver the photonic devices often touted, but never realized by PIC technology. Accordingly, in U.S. patent application Ser. No. 09/717,851, filed on Nov. 21, 2000, entitled "Photonic Integrated Detector Having a Plurality of Asymmetric Waveguides," the contents of which are hereby incorporated by reference in their entirety, Applicants disclose a photo-detector device based on the asymmetric waveguide design. An embodiment of the photo-detector PIC comprises more than two asymmetric waveguides. The asymmetric waveguide photodetectors are highly responsive and operable at very high frequencies.

The development of the asymmetric waveguide photo-detector device shows great promise for asymmetric waveguide PICs. However, the need still exists for the development of other types of PIC devices. More specifically there is a need for improved laser devices such as electroabsorption-modulated lasers (EMLs). EMLs are often employed as transmitters in optical fiber communication systems. An EML device typically comprises a laser integrated with an electroabsorption modulator at the laser output. The laser may be, for example, a distributed-feedback (DFB) or a distributed Bragg-reflector (DBR) device, which is operated continuously to ensure stability of output power and wavelength. The electroabsorption (EA) modulator is optically coupled to the laser output and modulates the signal generated by the laser.

There are numerous difficulties associated with creating a monolithically integrated, high speed EML. First, the active regions of the laser and modulator typically require quantum wells that emit at different wavelengths. This design restraint is generally satisfied by designing the laser and modulator with different thicknesses and/or with different materials. Also, efficient optical coupling is required between the laser and the modulator, as well as, in the case of a DBR laser, between the laser's active region and grating. Furthermore, effective electrical isolation between the active devices of the laser and modulator is required to avoid crosstalk between the two devices.

Existing methods of fabricating monolithic EML devices typically involve either multiple semiconductor regrowth steps to separately fabricate the laser and EA modulator, or a single growth on a specially prepared substrate wherein dielectric masks create different bandgaps in adjacent regions of the wafer. Either of these methods is complex and typically results in poor yield and therefore very high costs for finished product.

Accordingly, there is a need in the art for an improved EML that provides efficient coupling and effective isolation and which can be manufactured relatively inexpensively.

SUMMARY OF THE INVENTION

Briefly, the present invention meets these and other needs in the art.

According to a first aspect of the invention, a monolithic asymmetric twin waveguide based electroabsorption-modulated laser device is provided. The laser device comprises a first waveguide having a gain region, such as a multi-quantum well region, for amplifying primarily a first mode of light, and a second waveguide having a modulator formed therein for modulating a second mode of light propagating in the second waveguide and having a different effective index of refraction than the first mode of light. The first waveguide is positioned vertically on top of the second waveguide and has a lateral taper formed therein for moving light between the first waveguide and the second waveguide. According to this first aspect of the invention, the first mode of light is amplified in the first waveguide and transferred into the second waveguide by the lateral taper. At the end of the second waveguide, the light encounters the modulator, which causes a modulated optical signal to be emitted from the device.

According to another aspect of the invention, an electroabsorption modulated laser device comprising more than two vertically integrated asymmetric waveguides is disclosed. The laser device comprises a first waveguide having a gain region, such as a multi-quantum well region, for amplifying primarily a first mode of light, a second waveguide having a distributed Bragg reflector therein and for guiding primarily a second mode of light having a different index of refraction from the first mode of light, and a third waveguide having a modulator formed therein for modulating a third mode of light propagating in the third waveguide and having a different effective index of refraction than the second mode of light. The first waveguide is positioned vertically on top of the second waveguide and the second waveguide is positioned vertically on top of the third waveguide. The first waveguide has a lateral taper formed therein for transferring light between the first waveguide and the second waveguide, and the second waveguide has a lateral taper formed therein for transferring light from the second waveguide to the third waveguide. The first mode of light is amplified in the first waveguide and transferred into the second waveguide by the lateral taper. The light propagates in the second waveguide as the second mode of light and is transferred into the third waveguide by the lateral taper. The modulator in the third waveguide causes the signal to be modulated at the output of the device.

According to yet another aspect of the invention, an electroabsorption modulated laser device employing a distributed feedback (DFB) laser is disclosed. The DFB modulated laser device comprises a first waveguide and a second waveguide. The first waveguide has a gain region and a grating therein to form a DFB laser. A signal out of the DFB laser is transferred via a lateral taper into the second waveguide wherein the signal is modulated. Light propagating in the first waveguide has a different effective index of refraction than the mode of light propagating in the second waveguide.

Modulated lasers in accordance with the invention provide efficient optical coupling between the laser and modulator as well as effective electrical isolation between the laser and modulator devices. Furthermore, modulated lasers in accordance with the invention can be manufactured through a process that requires only a single epitaxial growth step. Post-growth processing steps determine the location of the laser and modulator. This simplifies the manufacturing process and allows for a high yield, relatively low cost integration method.

Additional aspects of the invention are described in detail below.

BRIEF DESCRIPTION OF THE DRAWINGS

Other features of the invention will be further apparent from the following detailed description of presently preferred exemplary embodiments of the invention taken in conjunction with the accompanying drawings, of which:

FIG. 7A provides a graph of the output power through a modulator versus current for an asymmetric twin waveguide electroabsorption modulated laser device in accordance with the invention;

FIG. 7B is a graph of output power extinction ratio versus applied modulator voltage for an asymmetric twin waveguide electroabsorption modulated laser in accordance with the invention;

DETAILED DESCRIPTION OF THE INVENTION

Systems and methods with the above-mentioned beneficial features in accordance with a presently preferred exemplary embodiment of the invention will be described below with reference to FIGS. 1–12B. It will be appreciated by those of ordinary skill in the art that the description given herein with respect to those figures is for illustrative purposes only and is not intended in any way to limit the scope of the invention. All questions regarding the scope of the invention may be resolved by referring to the appended claims.

Generally, the present application is directed toward monolithically integrated asymmetric waveguide structures. An asymmetric twin waveguide (ATG) design has been disclosed in co-pending U.S. patent application Ser. No. 09/337,785, filed on Jun. 22, 1999, entitled "Twin Waveguide Based Design for Photonic Integrated Circuits," the contents of which are hereby incorporated by reference in their entirety. Generally, the ATG design employs two waveguides wherein each waveguide is designed to guide primarily one mode of light with each mode having a different effective index of refraction. A lateral taper in one of the waveguides induces coupling of light between the waveguides. The lateral taper operates to change the effective refractive index of a mode of light traveling in the first waveguide to a second mode that propagates primarily in the second waveguide. This transition occurs over the length of the taper. Thus, a mode of light having a first index of refraction may begin to propagate in second waveguide at the beginning of a taper, and be transitioned to a second mode of light having a lower effective index of refraction by the end of the taper region which causes the mode to be essentially locked into propagating in the second waveguide.

The present application is directed toward laser PIC devices having a plurality of vertically integrated asymmetric waveguides with lateral tapers formed therein. According to a first aspect of the invention, an electroabsorption modulated laser device is provided having a twin asymmetric waveguide design. Light is amplified across the length of a first waveguide and coupled into a second waveguide via a lateral taper. A modulator operates to modulate the light propagating in the second waveguide. Thus, light that is generated and amplified in the first asymmetric waveguide is modulated by a modulator in the second asymmetric waveguide.

Figure 1:
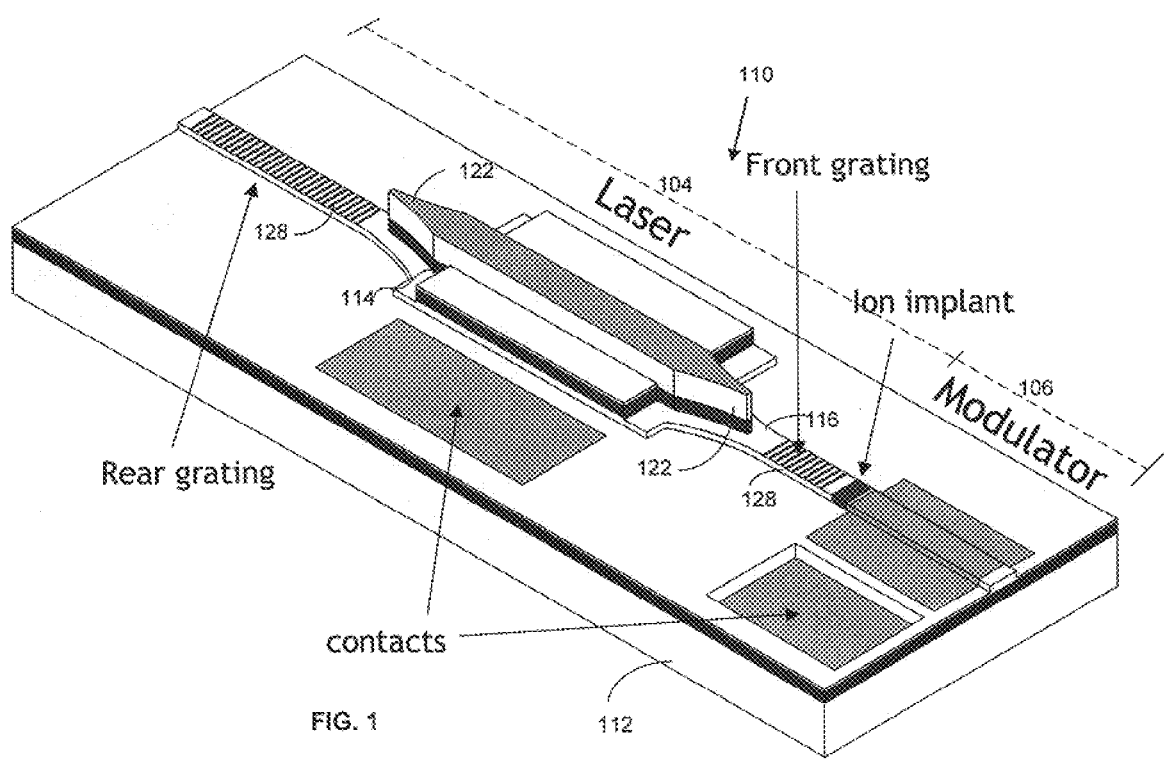
FIG. 1 is a perspective view of an asymmetric twin waveguide electroabsorption modulated laser in accordance with an aspect of the invention.

FIG. 1 provides a perspective view of an exemplary asymmetric twin waveguide electroabsorption modulated laser in accordance with an aspect of the present invention. As shown, electroabsorption modulated laser device 110 comprises a laser region 104 and a modulator region 106. A signal generated by laser region 104 is modulated by modulator 106.

Generally, device 110 comprises first waveguide 114 and second waveguide 116 situated on substrate 112. As explained in detail below with reference to FIGS. 2 and 3, waveguide 114 has a gain region formed therein for amplifying light propagating in the waveguide. The light propagating in waveguide 114 is transferred into waveguide 116 via lateral tapers 122 formed in waveguide 114. Waveguide 116 has grating sections 128 formed therein. Grating sections 128 operate with the gain section in waveguide 114 to form a distributed Bragg reflector (DBR) laser. Thus, laser region 104 comprises waveguide 114 and the portion of waveguide 116 between gratings 128. The light emitted by the DBR laser region 104 enters modulator region 106 of waveguide 116. Modulator region 106 operates to modulate the signal out of the laser.

Figure 2:
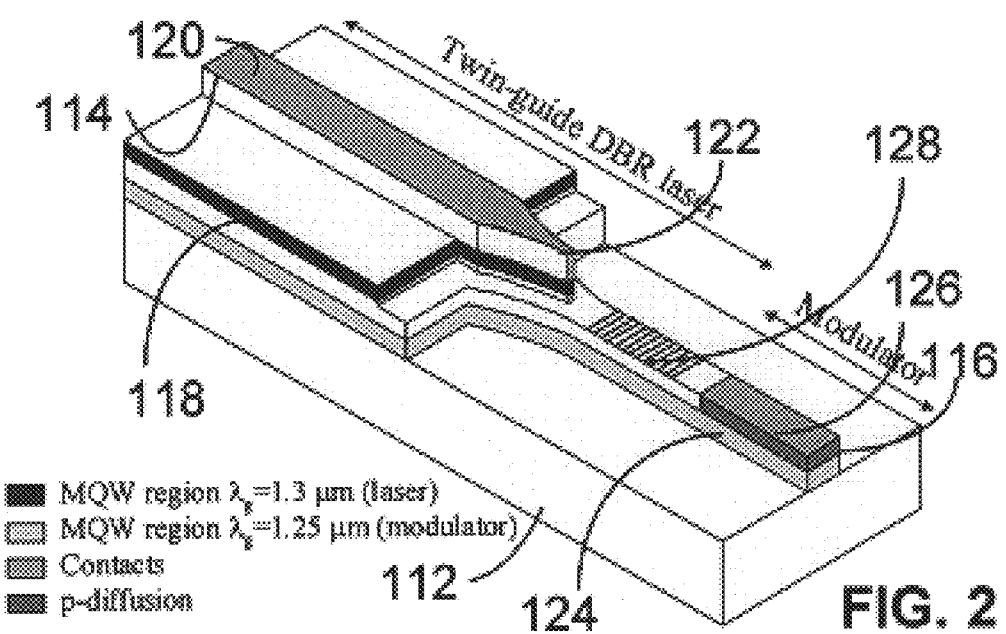
FIG. 2 is a perspective view of a portion of an asymmetric twin waveguide electroabsorption modulated laser in accordance with an aspect of the invention.

FIG. 2 provides a perspective view of a portion of an exemplary asymmetric twin waveguide electroabsorption modulated laser in accordance with an aspect of the present invention. As shown, the monolithically integrated twin waveguide modulated laser device 110 is situated on substrate 112 and comprises a first waveguide 114 and a second waveguide 116. Waveguide 114 has multi-quantum well area 118 formed therein for amplifying light propagating in waveguide 114. In one embodiment, quantum well area 118 comprises five quantum wells. Laser electrical contact area 120 is used to apply a voltage across multi-quantum well area 118 and thereby generate a lasing signal. In the exemplary embodiment, the materials and relative thickness of those materials comprising waveguide 114 have been selected such that a single mode of light propagates primarily in waveguide 114. In an exemplary embodiment, the single mode of light has an effective index of refraction of about 3.24.

Waveguide 114 has lateral tapers 122 formed therein for transferring light into waveguide 116. The width of the tapered end of waveguide 116, referred to herein as $W_{TAPEND}$, is 1 $\mu$m. The width of the taper at one point, which in the exemplary embodiment is the taper's widest point, referred to herein as $W_{TAP}$, is between about 1.8 and 2.2 $\mu$m. The length of the taper from its end to the point corresponding to $W_{TAP}$, which is referred to herein as $L_{TAP}$, is between about 100 and 1250 $\mu$m. The above described values for $W_{TAPEND}$, $W_{TAP}$, and $L_{TAP}$ result in a lateral taper angle, $\theta$, of between about 0.09 and 0.23 degrees.

Waveguide 116 is located below waveguide 114 and is integrally formed therewith. Waveguide 116 has been designed to guide primarily one mode of light wherein the mode of light has a lower effective index of refraction than the mode of light propagating in waveguide 114. In an exemplary embodiment, the effective index of refraction of the mode of light propagating in waveguide 116 is between about 3.2 and 3.21.

Waveguide 116 comprises multi-quantum well region 124, which, in one embodiment comprises ten quantum wells. Electrical contact 126 is used to induce a reverse bias across quantum well region 124 so as to induce bandgap shift and absorption. The reverse bias results in the modulation of the signal being output from waveguide 126.

Generally, multi-quantum well region 124 is transparent to the laser emission wavelength due to bandgap detuning. Therefore, a distributed Bragg grating reflector 128 is etched into waveguide 116. The result is a frequency-stabilized distributed Bragg reflector (DBR) laser 104 whose one frequency optical output is directed along waveguide 116.

Figure 3:
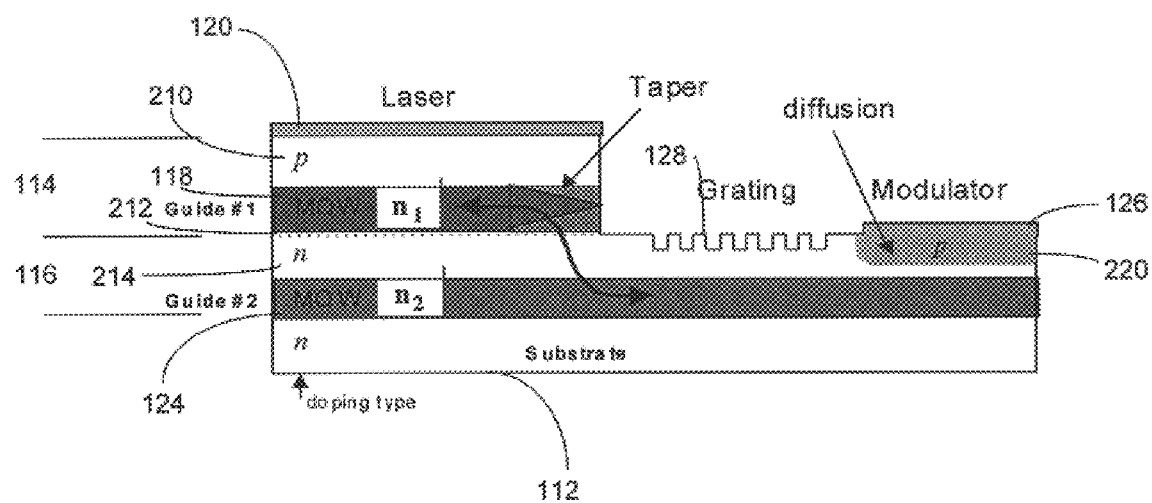
FIG. 3 is a sectional view of an asymmetric twin waveguide electroabsorption modulated laser in accordance with the invention.

As previously mentioned, an important design consideration for electroabsorption modulated lasers is having effective electrical isolation between the laser and the modulator. Electrical isolation allows for independent biasing of the two devices. FIG. 3 provides a sectional view of the asymmetric twin waveguide laser shown in FIG. 2. As shown, waveguide 114 comprises a p doped area 210, multi-quantum well region 118, and n doped region 212. Waveguide 116 is situated on top of n+ doped substrate 112 and comprises quantum well region 124, and n+ doped region 214. N doped region 214 is situated adjacent to n doped region 212 of waveguide 114.

A portion of top cladding layer 214 of waveguide 116 located under contact 126 is converted locally to a p type region 220 using acceptor diffusion. The diffusion creates a p-n junction in the region under contact 126. A forward bias is applied to the laser portion of the device by applying a voltage across contact 120 and substrate 112 or alternatively across contact 120 and a sidecontact to layer 214. Applying a negative voltage between modulator contact 126 and substrate 112 creates a reverse bias across quantum well region 124. At the junction of region 220 and cladding 214 a reverse biased p-n junction is formed that provides electric isolation between the modulator and the laser. Thus, the composition of the waveguides operates to provide electrical isolation between the laser and modulator.

Figure 4:
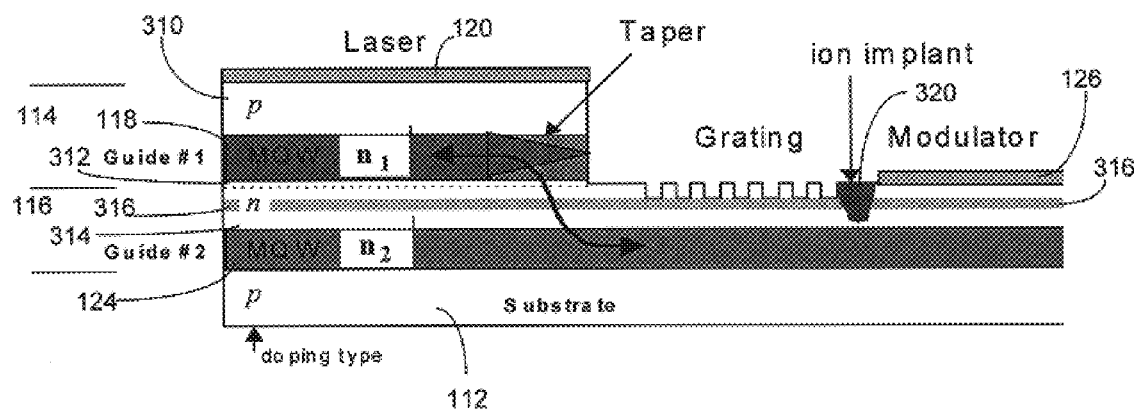
FIG. 4 is a sectional view of an alternative embodiment of an asymmetric twin waveguide electroabsorption modulated laser in accordance with an aspect of the invention.

An alternative embodiment for providing electrical isolation to the asymmetric twin waveguide laser is depicted in FIG. 4. As shown, waveguide 114 comprises a p doped region 310, n doped region 312, and quantum well area 118. Waveguide 116 is situated on top of substrate 112 and below waveguide 114. Waveguide 116 comprises n doped cladding layer 314, quantum well region 124, and highly n+ doped contact layer 316.

Forward bias for the laser is applied across laser contact 120 and n+ layer 316. Reverse bias for the modulator is applied between n+ contact layer 316 and substrate 112. Thus, in the embodiment of FIG. 4, the laser and the modulator share contact layer 316 as a common ground. In order to isolate the laser more effectively from the modulator, ion implantation region 320 is formed in n+ layer 312, contact layer 316, and n+ layer 314. The ion implantation region creates a resistance of several hundred kilo-Ohms between the laser and the modulator. This added resistance serves to minimize crosstalk between the two devices.

As previously mentioned, a great advantage of asymmetric waveguide technology is that it lends itself to the creation of devices using a single growth step. A wafer for use in creating an asymmetric waveguide based modulated laser as described above with reference to FIGS. 1 through 4 may be grown as follows. First, a 0.5 μm thick InP buffer layer is grown on a (100) p-doped InP substrate 112. Next the modulator MQW region 124 is grown. The MQW region 124 comprises ten InGaAsP quantum wells with an emission wavelength of about λ=1.50 μm, separated by nine InGaAsP barriers with a bandgap wavelength of about $\lambda_g$=1.2 μm. These layers are sandwiched between two InGaAsP (bandgap wavelength $\lambda_g$=1.05 μm) separate confinement heterostructure (SCH) layers, which are each about 0.05 μm thick. The modulator is followed by a 0.35 μm thick InP layer, a 0.05 μm thick n+ doped InGaAsP layer, and another 0.35 μm thick InP layer. The laser MQW region 118 is grown on top of this. The laser waveguide MQW region 118 comprises five InGaAsP quantum wells with an emission wavelength of about λ=1.55 μm, which are separated by four InGaAsP barriers with a bandgap wavelength of about $\lambda_g$=1.2 μm. These layers are sandwiched between two InGaAsP (bandgap wavelength $\lambda_g$=1.2 μm) SCH layers which are about 0.15 μm thick. On top of the laser, a 0.1 μm InP layer is grown, followed by a 0.02 μm InGaAsP etch stop, and a 1 μm thick InP top cladding layer. Finally, a 0.2 μm thick, p+ doped InGaAsP layer (bandgap wavelength $\lambda_g$=1.2 μm) is grown on the cladding layer.

Figure 5A:
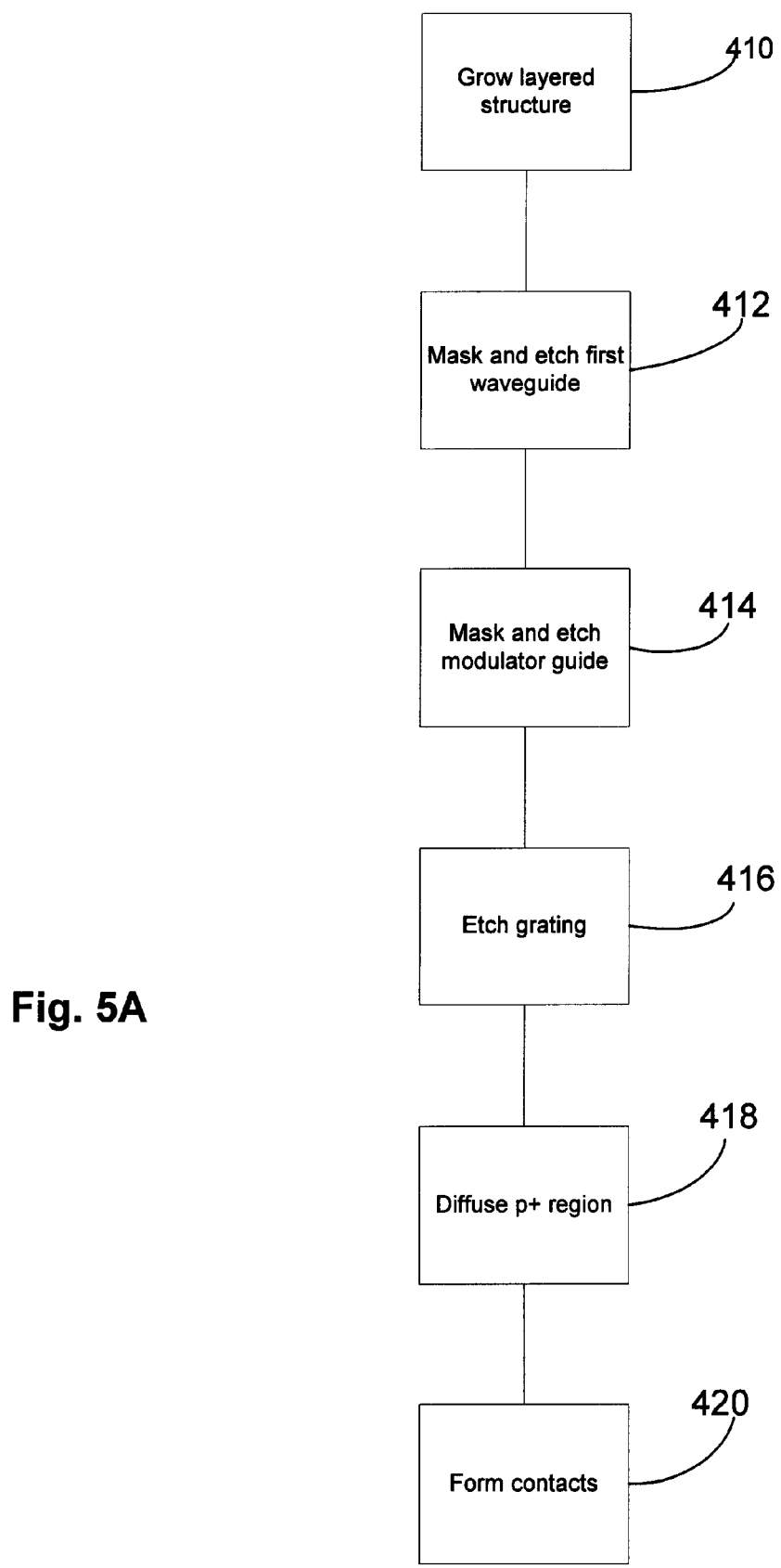
FIG. 5A is a flowchart of a process for manufacturing an asymmetric twin waveguide electroabsorption modulated laser in accordance with an aspect of the invention.

FIG. 5A is a flowchart of a process for manufacturing an asymmetric twin waveguide electroabsorption modulated laser as depicted in FIG. 3. The modulated laser is manufactured through a series of masking and etching steps. As shown, at step 410, a monolithic structure comprising layers as described above is grown by molecular beam epitaxy (MBE) or metal-organic chemical vapor deposition (MOCVD), for example, in a single epitaxial step on n+ doped substrate 112. At step 412, the outline of waveguide 114, which has lateral taper 122 formed therein, is defined via masking, and the surrounding layers etched away to the top of waveguide 116. At step 414, waveguide 116 is defined via masking and the surrounding areas etched away to the top of substrate 112. At step 416, the grating 128 is formed in waveguide 116 via an interferometric method or e-beam lithography. At step 418, p+ region 220 is formed in waveguide 116 using acceptor impurity diffusion techniques. At step 420 contacts 120 and 126 are formed on waveguide 114 and waveguide 116 respectively.

Figure 5B:
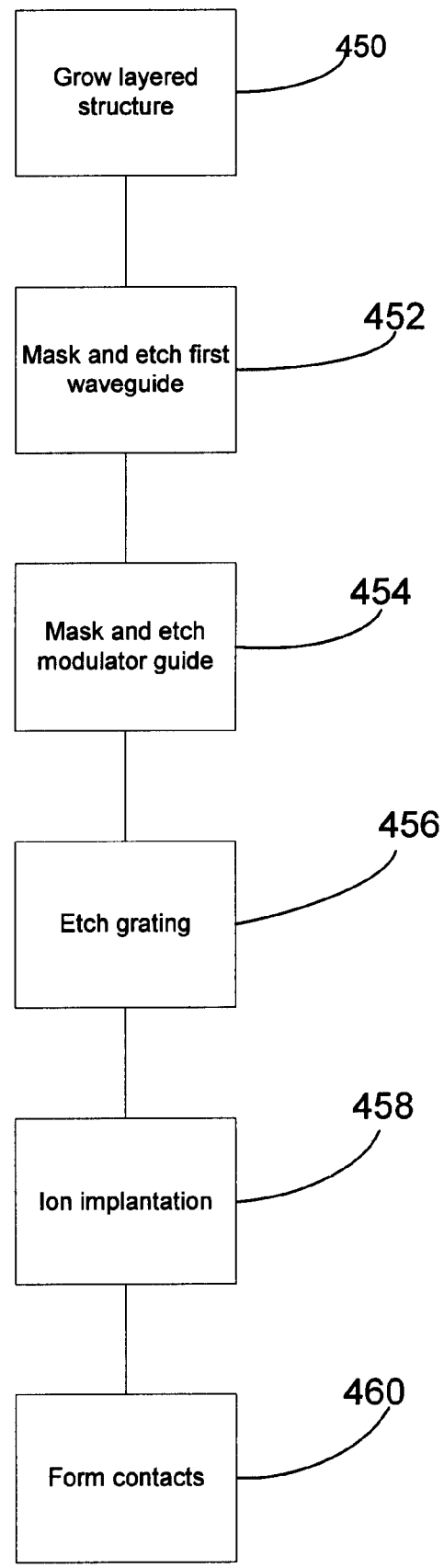
FIG. 5B is a flowchart of a process for manufacturing an alternative embodiment of an asymmetric twin waveguide electroabsorption modulated laser in accordance with an aspect of the invention.

FIG. 5B is a flowchart of a process for manufacturing an asymmetric twin waveguide electroabsorption modulated laser as depicted in FIG. 4. As shown, at step 450, a monolithic structure comprising layers as described above is grown by MBE or MOCVD, for example, in a single epitaxial step on p+ doped substrate 112. At step 452, the outline of waveguide 114, which has lateral taper 122 formed therein, is defined via masking, and the surrounding layers etched away to the top of waveguide 116. At step 454, waveguide 116 is defined via masking and the surrounding areas etched away to the top of substrate 112. At step 456, the grating 128 is formed in waveguide 116 via an inteferometric method or e-beam lithography. At step 458, electrical isolation region 320 is formed in waveguide 116 using standard ion implantation techniques. At step 460, contacts 120 and 126 are formed on waveguide 114 and waveguide 116 respectively.

Figure 6:
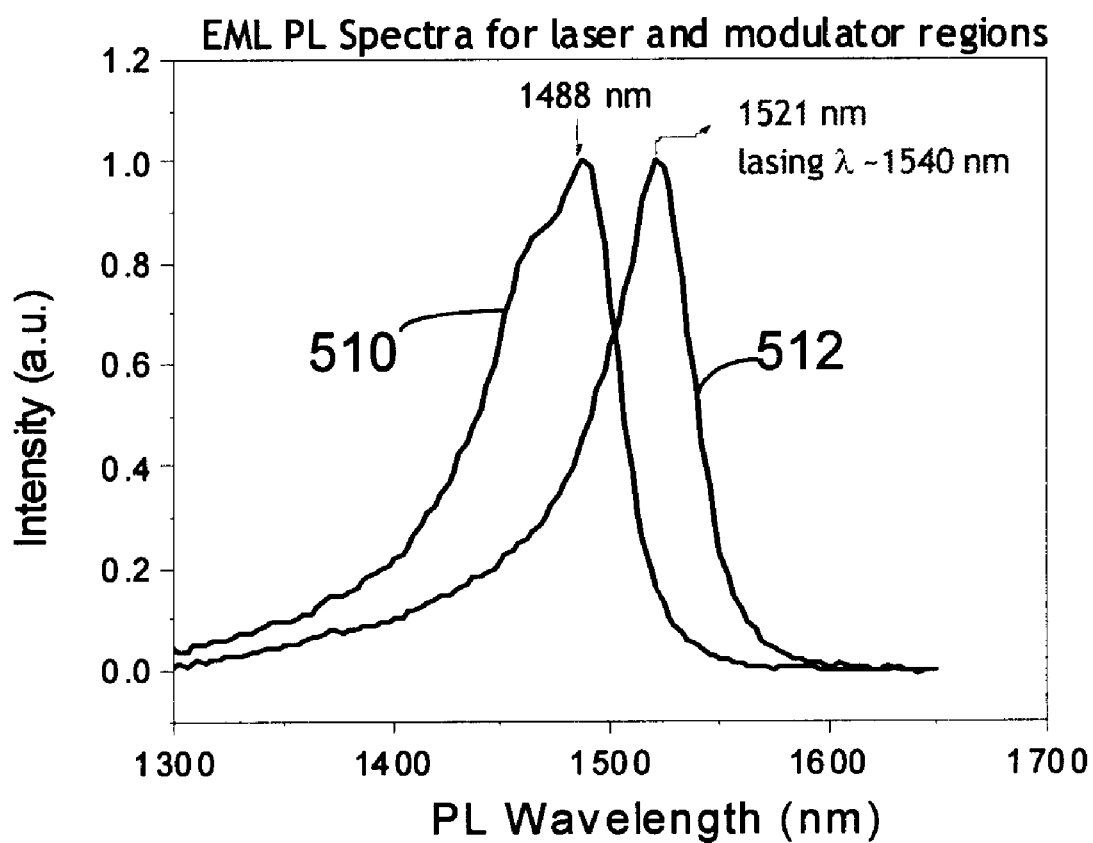
FIG. 6 provides a graph of the intensity of photoluminscence spectra versus photoluminescence wavelength for the laser and modulator of a device in accordance with the invention.

FIG. 6 provides a graph of the intensity of photoluminscence spectra versus photoluminescence wavelength for each of the laser, represented by line 512, and the modulator, which is represented by line 510, of the device depicted in FIG. 4. As shown, there is a shift of 33 nm in the photoluminescence wavelength between the laser and modulator. The actual lasing wavelength is 1540 nm which is detuned by 52 nm from the modulator photoluminescence peak.

FIGS. 7A and 7B are graphs of the output from an asymmetric twin waveguide electroabsorption modulated laser device such as shown in FIG. 4. FIG. 7A provides a graph of the output power through the modulator versus laser drive current. FIG. 7B is a graph of output power extinction ratio versus applied modulator voltage.

Applicants have noted that placing contact 126, which is typically made of metal, in close proximity to quantum well 124 can lead to optical loss of the signal propagating in quantum well 124. Accordingly, there is a motivation to maximize the distance between modulator contact 126 and quantum well 124. In the modulated lasers of FIGS. 1 through 4, the cladding layers at the junction of waveguides 714 and 716 provide for the separation between contact 126 and quantum well 124. In order to achieve optimal operation of the modulator, the thickness of the cladding layer should be relatively large, for example, in the range of about 1 micrometer. Reducing the cladding thickness below 1 micrometer leads to a rapid increase in the waveguide loss in the modulator section.

Applicants have also discovered that the laser region 104 of device 110 operates best when the thickness of the cladding between waveguide 114 and 116 is about 0.5 micrometers. When the cladding is about 0.5 micrometers, a relatively short taper 122 provides very low coupling loss between waveguide 114 and 116. Increasing the cladding thickness to between 0.8 and 1 micrometer requires increasing the taper length in order to maintain a low coupling loss. However, increasing taper length makes the taper more susceptible to processing variations. Furthermore, long active tapers can lead to high threshold currents due to relatively large non-radiative recombination inside the taper caused by etching through the quantum well region.

Thus, optimizing performance of the modulator region 106 and the laser region 104 present conflicting design considerations—the modulator operates best when the cladding between contact 126 and quantum well 124 is large while the laser works best when this cladding layer is minimized. In an attempt to satisfy both design considerations, Applicants have developed a modulated laser design having more than two asymmetric waveguides. The introduction of a third waveguide allows for the laser and modulator components to be independently optimized.

Accordingly, an electroabsorption modulated laser device is provided having more than two asymmetric waveguides. Light is amplified across the length of a first waveguide and coupled into a second waveguide via a lateral taper. The second waveguide comprises a distributed Bragg reflector to ensure stability of power and wavelength in the optical signal. Light passing through the reflector is coupled into a third waveguide via a second lateral taper. A modulator in the third waveguide operates to modulate the light signal.

Figure 8:
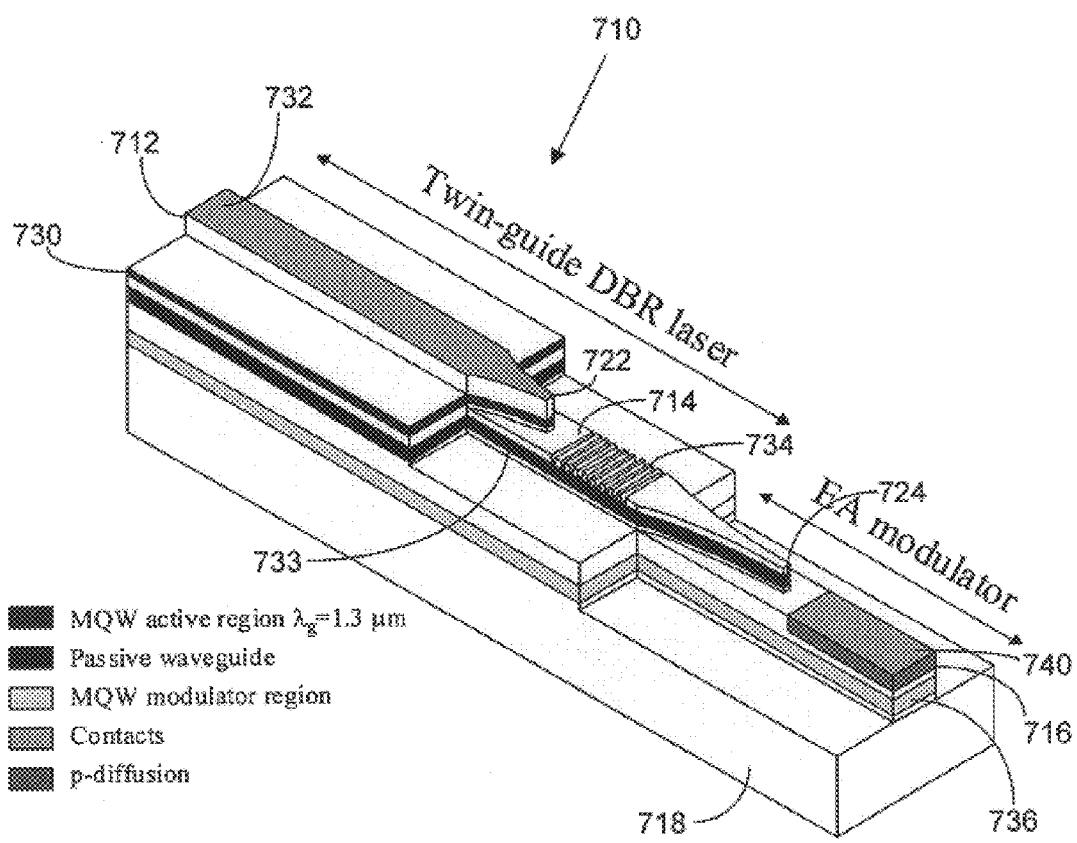
FIG. 8 is a perspective view of a portion of an asymmetric waveguide electroabsorption modulated laser in accordance with the invention.

FIG. 8 provides a perspective view of an exemplary electroabsorption modulated laser device 710 comprising more than two asymmetric waveguides. As shown, device 710 comprises laser waveguide 712, passive waveguide 714, and modulator waveguide 716, all of which are situated on substrate 718. The materials and relative thicknesses of those materials that comprise waveguides 712, 714, and 716 are selected such that a different mode of light, each having a different effective index of refraction, propagates primarily in each of the waveguides. Waveguide 712 has lateral tapers 722 formed therein for moving light between waveguide 712 and waveguide 714. Likewise, waveguide 714 has lateral tapers 724 formed therein for moving light between waveguide 714 and waveguide 716.

Waveguide 712 comprises multi-quantum well area 730 for amplifying light propagating in waveguide 712. Laser electrical contact area 732 is used to apply a voltage across multi-quantum well area 730 for purposes of amplifying the signal in the waveguide. In the exemplary embodiment, the materials and relative thickness of those materials comprising waveguide 712 have been selected such that a single mode of light propagates primarily in waveguide 712. In an exemplary embodiment, the single mode of light has an effective index of refraction of about 3.26. Lateral taper 722 operates to guide the amplified light into waveguide 714. In the exemplary embodiment, taper 722 is between about 100 and 250 micrometers.

Waveguide 714 is located below waveguide 712 and is integrally formed therewith. Waveguide 714 comprises passive propagating area 733 for moving light received from waveguide 712 to grating section 734. Grating sections 714 forms a distributed Bragg reflector that reflects back predominantly one frequency of light.

Lateral taper 724 operates to transfer the light propagating in waveguide 714 into waveguide 716. Waveguide 714 is made from a high optical quality material with very low loss at the lasing wavelength such as, for example InGaAsP lattice matched to InP. Furthermore, taper 724 is relatively long, for example, in the range between about 250 and 600 micrometers. The high quality, low optical loss material and long taper provide for an efficient coupling between waveguide 714 and 716. Waveguide 714 is designed to guide primarily one mode of light wherein the mode of light has a lower effective index of refraction than the mode of light propagating in waveguide 712. In an exemplary embodiment, the effective index of refraction of the mode of light propagating in waveguide 714 is between about 3.23 and 3.24.

Waveguide 716 is located vertically below waveguide 714 and is integrally formed therewith. Waveguide 716 comprises multi-quantum well region 736 and has electrical contact 740 formed thereon. Contact 740 is used to induce a reverse bias across quantum well region 736 so as to induce bandgap shift and absorption of the signal propagating in the waveguide. The reverse bias provides the capability to modulate the signal being output from waveguide 716. Waveguide 716 is designed to guide primarily one mode of light wherein the mode of light has a lower effective index of refraction than the mode of light propagating in waveguide 714. In an exemplary embodiment, the effective index of refraction of the mode of light propagating in waveguide 716 is between about 3.2 and 3.21.

Figure 9:
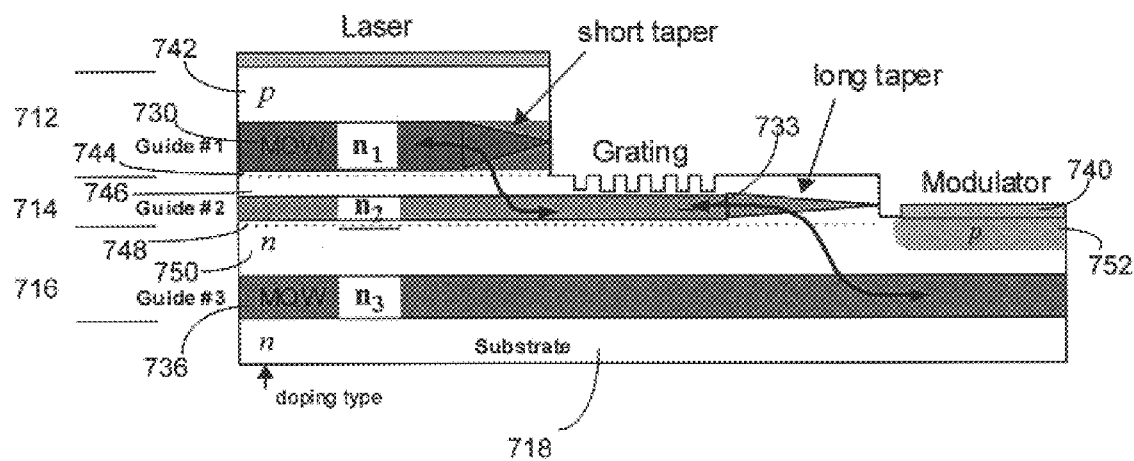
FIG. 9 is a sectional view of an asymmetric waveguide electroabsorption modulated laser in accordance with the invention.

FIG. 9 provides a sectional view of the modulated laser device 710. As shown, in the exemplary embodiment, waveguide 712 comprises p doped cladding layer 742, multi-quantum well region 730, and n doped region 744. Waveguide 714 comprises n doped region 746, passive waveguide region 733, and n doped region 748. Waveguide 716 comprises n doped region 750 and multi-quantum well region 736. P doped region 752 is created in n cladding layer 750 and operates similarly to that described above with reference to FIG. 3.

Those skilled in the art will recognize that the introduction of waveguide 714 between waveguide 712 and waveguide 716 provides for the laser and modulator portions of the device to be independently optimized. With respect to the laser portion of the device, the thickness of cladding layers 744 and 746 at the junction of waveguides 712 and 714 can be minimized so as to provide for a short taper 722. For example, in one embodiment, the cladding thickness is about 0.5 micrometers, which allows for the use of a taper 722 of between about 100 and 120 micrometers. The thin cladding and associated short taper provide for an efficient coupling between quantum well region 730 and grating 734. Additionally, waveguide 714 is made from a high optical quality material with no quantum wells and very low optical loss. These characteristics reduce excess loss in the grating and the laser cavity. Furthermore, the relative thinness of the cladding layers provides for a relatively shallow grating in order to form Bragg grating 734.

With respect to the modulator portion of the device, the thickness of cladding layers 748 and 750 at the junction of waveguides 714 and 716 can be maximized so as to increase the space between contact 740 and quantum well region 736. The increased thickness of the cladding minimizes the interference by contact 740 with signals propagating in waveguide 716.

A wafer for use in creating an asymmetric waveguide based modulated laser as described above with reference to FIGS. 8 through 9 may be grown as follows.

First, a 0.5 $\mu$m thick InP buffer layer is grown on a (100) p-doped InP substrate 718. Next the modulator MQW region 736 is grown. The modulator MQW region 736 comprises ten InGaAsP quantum wells with an emission wavelength of about $\lambda$=1.50 $\mu$m, separated by nine InGaAsP barriers with a bandgap wavelength of about $\lambda_g$=1.2 $\mu$m. These layers are sandwiched between two InGaAsP (bandgap wavelength $\lambda_g$=1.05 $\mu$m) separate confinement heterostructure (SCH) layers, which are each about 0.05 $\mu$m thick. The modulator waveguide 716 is followed by a 1 $\mu$m thick InP layer that separates it from passive waveguide 714. Passive waveguide 714 is grown next, and comprises a 0.5 $\mu$m thick InGaAsP (bandgap wavelength $\lambda_g$=1.2 $\mu$m) layer. This is followed by a 0.22 $\mu$m thick InP layer, a 0.05 $\mu$m thick, n+ doped InGaAsP layer, and another 0.22 µm thick InP layer. Laser MQW waveguide 712 is grown on top of this. Laser waveguide 712 comprises five InGaAsP quantum wells with an emission wavelength of about λ=1.55 µm, which are separated by four InGaAsP barriers with a bandgap wavelength of about $\lambda_g$=1.2 µm. These layers are sandwiched between two InGaAsP (bandgap wavelength $\lambda_g$=1.2 µm) SCH layers which are about 0.17 µm thick. On top of these layers, a 0.1 µm InP layer is grown, followed by a 0.02 µm InGaAsP etch stop, and a 1 µm thick InP top cladding layer. Finally, a 0.2 µm thick, p+.doped InGaAsP layer (bandgap wavelength $\lambda_g$=1.2 µm) is grown on the cladding layer.

Figure 10:
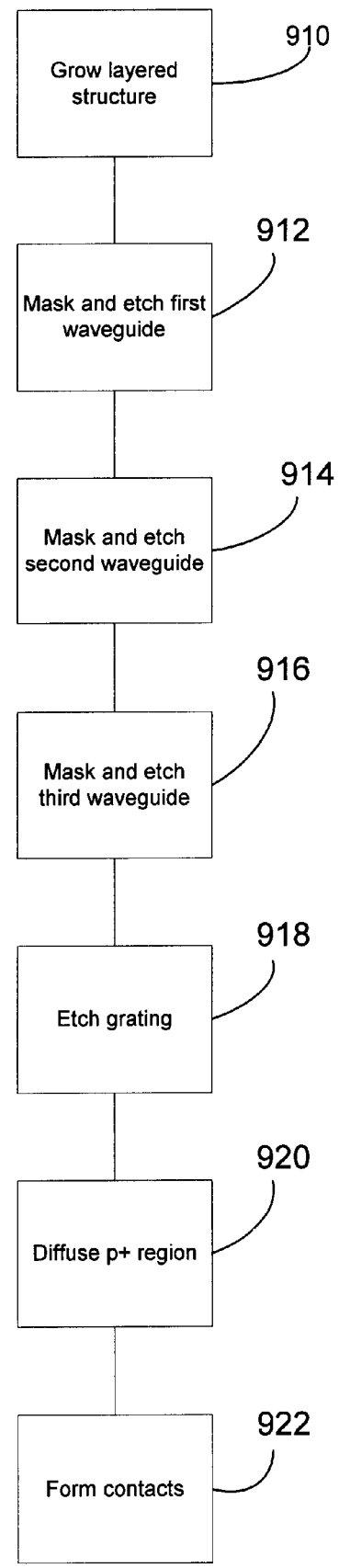
FIG. 10 is a flowchart of a process for manufacturing an asymmetric waveguide electroabsorption modulated laser in accordance with an aspect of the invention.

FIG. 10 is a flowchart of a process for manufacturing an asymmetric twin waveguide electroabsorption modulated laser as depicted in FIGS. 8 and 9. The modulated laser is manufactured through a series of masking and etching steps. As shown, at step 910, a monolithic structure comprising layers as described above is grown by MBE or MOCVD, for example, in a single epitaxial step on n+ doped substrate 718. At step 912, the outline of waveguide 712, which has lateral taper 722 formed therein, is defined via masking, and the surrounding layers etched away to the top of waveguide 714. At step 914, waveguide 714, which has lateral taper 724 formed therein, is defined via masking and the surrounding areas etched away to the top of waveguide 716. At step 916, the outline of waveguide 716 is defined via masking, and the surrounding layers etched away to the top of substrate 718. At step 918, grating reflector 734 is formed in waveguide 714 via an interferometric method or e-beam lithography. At step 920, p+ region 752 is formed in waveguide 716 using acceptor impurity diffusion techniques. At step 922 contacts 120 and 126 are formed on waveguide 712 and waveguide 714 respectively.

Figure 11:
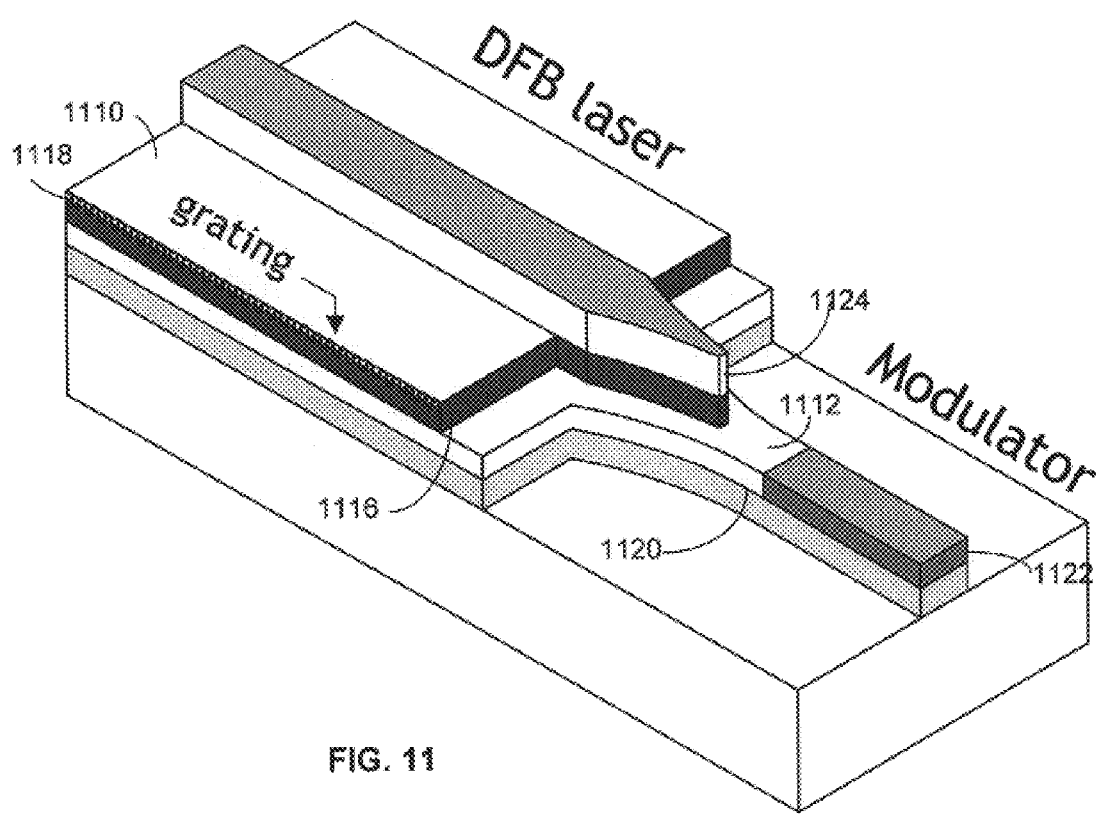
FIG. 11 is a perspective view of a portion of an asymmetric twin waveguide electroabsorption modulated laser in accordance with an aspect of the invention.

The devices described with respect to FIGS. 1 through 10 employ a DBR laser design. It should be noted, however, that a device in accordance with the invention might alternatively employ a distributed feedback (DFB) laser. FIG. 11 provides a perspective view of an electroabsorption modulated laser device in accordance with the invention comprising a DFB laser. As shown, the device of FIG. 11 comprises a first waveguide 1110 and a second waveguide 1112. Waveguide 1110 comprises a gain region 1116 and grating 1118 to form a DFB laser. Waveguide 1112 comprises a gain region 1120 and a modulator region 1122. A signal out of the DFB laser is transferred via lateral taper 1124 into waveguide 1114 where the signal is modulated. In contrast to the embodiments described above, the laser portion of the device of FIG. 11 is comprised entirely in top waveguide 1110. Accordingly, there are no grating sections in second waveguide 1112.

The device depicted in FIG. 11 is consistent with the asymmetric designs designed above. Accordingly, the light propagating in waveguide 1110 has a different effective index of refraction than the mode of light propagating in waveguide 1112.

Figure 12A:
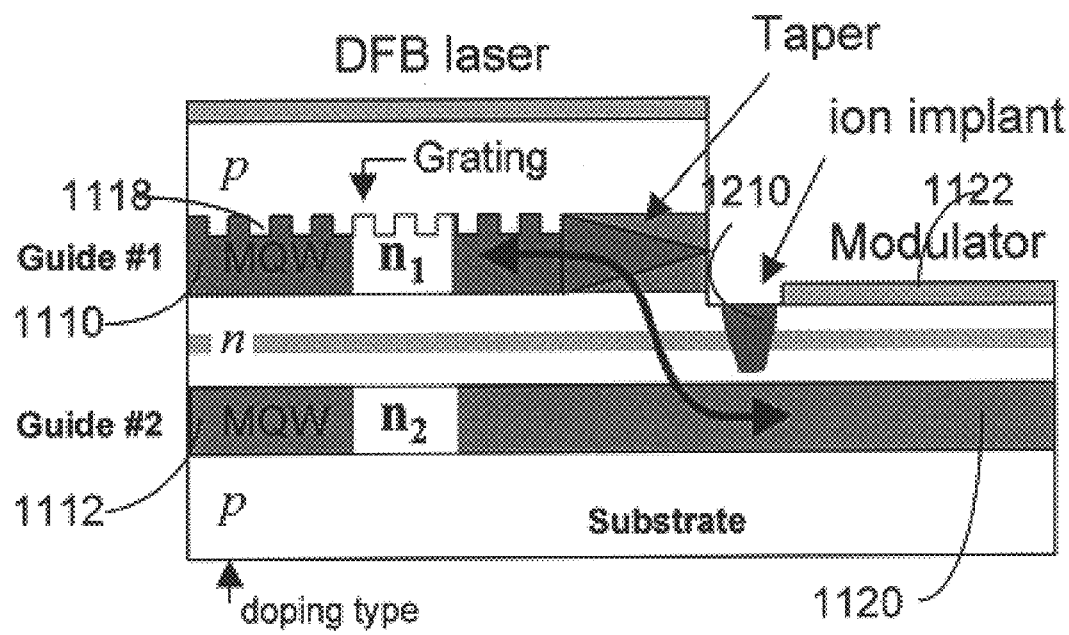
FIG. 12A is a sectional view of an asymmetric twin waveguide electroabsorption modulated laser in accordance with the invention.
Figure 12B:
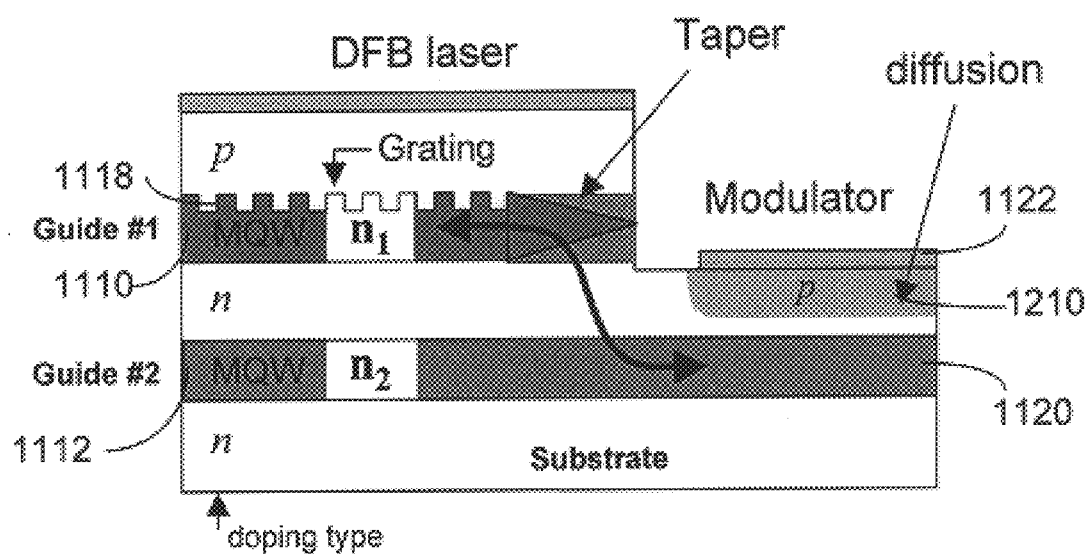
FIG. 12B is a sectional view of an alternative embodiment of an asymmetric twin waveguide electroabsorption modulated laser in accordance with an aspect of the invention.

FIGS. 12A and 12B provide sectional views of two alternative embodiments of the device of FIG. 11. As shown, in the device of FIG. 12A isolation is provided between the laser region of the device and the modulator region of the device using ion implant region 1210 which operates similarly to the embodiments described above with respect to FIG. 4. Isolation is provided in the embodiment of FIG. 12B using a diffusion area 1212 which operates similarly to like embodiments described above with respect to FIG. 3. With respect to both embodiments, grating region 1118 is formed in the top waveguide.

Thus, there have been disclosed improved monolithic asymmetric waveguide electroabsorption modulated laser devices. According to an aspect of the invention, an asymmetric twin waveguide based electroabsorption modulated laser PIC is provided. According to another aspect of the invention, an electroabsorption modulated laser PIC with more than two asymmetric waveguides is provided. The exemplary embodiments of the improved laser devices provide efficient optical coupling between the laser and modulator and effective isolation between these same devices. The devices are operable at speeds at least as high as between 10 and 40 GHz. The devices are relatively simple and inexpensive to produce.

While the invention has been described and illustrated with reference to specific embodiments, those skilled in the art will recognize that modification and variations may be made without departing from the principles of the invention as described above and set forth in the following claims. For example, an asymmetric waveguide electroabsorption modulate laser in accordance with the invention may comprise doping arrangements and materials different than those described. Furthermore, the invention may be employed in a wide variety of devices. For example, an asymmetric waveguide electroabsorption modulated laser in accordance with the invention may be employed to make high sensitivity 40 GHz transmitters for optical communication links. Accordingly, reference should be made to the appended claims as indicating the scope of the invention.

What is claimed is:

1. A modulated laser device, comprising:
    a first waveguide having a gain region formed therein for amplifying at least a first mode of light;
    a second waveguide having a modulator formed therein for modulating a second mode of light propagating primarily in said second waveguide, said second waveguide positioned vertically relative to said first waveguide, wherein said first waveguide has a lateral taper formed therein for transferring said first mode of light between said first waveguide and said second waveguide and wherein said first mode of light has an effective index of refraction different from that of said second mode of light.

2. The laser device of claim 1, wherein said second mode of light has an effective index of refraction less than that of said first mode of light.

3. The laser device of claim 2, wherein said first waveguide is positioned vertically on top of said second waveguide.

4. The laser device of claim 1, wherein said gain region comprises a multi-quantum well region.

5. The laser device of claim 1, wherein said modulator is an electro-absorption modulator.

6. The laser device of claim 1, wherein said second waveguide comprises a multi-quantum well region.

7. The laser device of claim 6, wherein a reverse bias across the multi-quantum well region causes said second mode of light to be modulated.

8. The laser device of claim 1, wherein said second waveguide further comprises a grating for reflecting predominantly one frequency of light.

9. The laser device of claim 1, wherein said first waveguide comprises a p doped region, an n doped region, and a multi-quantum well positioned between said p doped region and said n doped region.

10. The laser device of claim 9, further comprising a p+ doped substrate, wherein said second waveguide comprises a multi-quantum well and an n doped region, said n doped region in said first waveguide positioned adjacent to said n doped region in said second waveguide.

11. The laser device of claim 9, further comprising an n+ doped substrate, wherein said second waveguide comprises a multi-quantum well and an n doped region, said n doped region in said first waveguide positioned adjacent to said n doped region in said second waveguide.

12. The laser device of claim 11, wherein said n doped region of said second waveguide has a p-type doped area formed therein for creating a p-n junction for modulating said modulator.

13. The laser device of claim 1, wherein said first waveguide comprises a distributed feedback (DFB) laser.

14. A laser device, comprising:
a first waveguide having a gain region formed therein for amplifying at least a first mode of light;
a second waveguide for guiding primarily a second mode of light, said second waveguide positioned vertically relative to said first waveguide, wherein said first waveguide has a lateral taper formed therein for transferring said first mode of light between said first waveguide and said second waveguide and wherein said first mode of light has an effective index of refraction different from that of said second mode of light; and
a third waveguide having a modulator formed therein for modulating a third mode of light propagating primarily in said third waveguide, said third waveguide positioned vertically relative to said second waveguide, wherein said second waveguide has a lateral taper formed therein for transferring said second mode of light between said second waveguide and said third waveguide and wherein said second mode of light has an effective index of refraction different from that of said third mode of light.

15. The laser device of claim 14, wherein said second mode of light has an effective index of refraction less than that of said first mode of light.

16. The laser device of claim 14, wherein said third mode of light has an effective index of refraction less than that of said second mode of light.

17. The laser device of claim 14, wherein said first waveguide is positioned vertically on top of said second waveguide and said second waveguide is positioned vertically on top of said third waveguide.

18. The laser device of claim 14, wherein said gain region comprises a multi-quantum well region.

19. The laser device of claim 14, wherein said modulator is an electro-absorption modulator.

20. The laser device of claim 14, wherein said third waveguide comprises a multi-quantum well region.

21. The laser device of claim 20, wherein a reverse bias across the multi-quantum well region causes said third mode of light to be modulated.

22. The laser device of claim 14, wherein said second waveguide comprises a grating for reflecting predominantly one frequency of light.

23. The laser device of claim 14, wherein said first waveguide comprises a p doped region, an n doped region, and a multi-quantum well positioned between said p doped region and said n doped region.

24. The laser device of claim 23, further comprising a p+ doped substrate, wherein said third waveguide comprises a multi-quantum well and an n doped region, said n doped region in said first waveguide positioned adjacent to said n doped region in said third waveguide.

25. The laser device of claim 23, further comprising an n+ doped substrate, wherein said third waveguide comprises a multi-quantum well and an n doped region, said n doped region in said first waveguide positioned adjacent to said n doped region in said second waveguide.

26. The laser device of claim 25, wherein said n doped region of said second waveguide has a p-type doped area formed therein for creating a p-n junction for modulating said modulator.

27. The laser device of claim 14, wherein said first waveguide comprises a distributed feedback (DFB) laser.

28. A modulated laser device, comprising:
a first waveguide comprising a gain region for amplifying at least a first mode of light and a grating region for reflecting predominantly one frequency of light; and
a second waveguide having a modulator formed therein for modulating a second mode of light propagating primarily in said second waveguide, said second waveguide positioned vertically relative to said first waveguide, wherein said first waveguide has a lateral taper formed therein for transferring said first mode of light between said first waveguide and said second waveguide and wherein said first mode of light has an effective index of refraction different from that of said second mode of light.

29. The laser device of claim 28, wherein said second mode of light has an effective index of refraction less than that of said first mode of light.

30. The laser device of claim 29, wherein said first waveguide is positioned vertically on top of said second waveguide.

31. The laser device of claim 28, wherein said gain region comprises a multi-quantum well region.

32. The laser device of claim 27, wherein said modulator is an electro-absorption modulator.

33. The laser device of claim 28, wherein said second waveguide comprises a multi-quantum well region.

34. The laser device of claim 33, wherein a reverse bias across the multi-quantum well region causes said second mode of light to be modulated.

35. The laser device of claim 28, wherein said first waveguide comprises a p doped region, an n doped region, and a multi-quantum well positioned between said p doped region and said n doped region.

36. The laser device of claim 28, further comprising a p+ doped substrate, wherein said second waveguide comprises a multi-quantum well and an n doped region, said n doped region in said first waveguide positioned adjacent to said n doped region in said second waveguide.

37. The laser device of claim 28, further comprising an n+ doped substrate, wherein said second waveguide comprises a multi-quantum well and an n doped region, said n doped region in said first waveguide positioned adjacent to said n doped region in said second waveguide.

38. The laser device of claim 37, wherein said n doped region of said second waveguide has a p-type doped area formed therein for creating a p-n junction for modulating said modulator.

39. The laser device of claim 28, wherein said first waveguide comprises a distributed feedback (DFB) laser.

* * * * *